(12) United States Patent  (10) Patent No.: US 7,208,351 B2
Usami  (45) Date of Patent: Apr. 24, 2007

(54) ELECTRONIC DEVICE AND METHOD OF MANUFACTURE THE SAME

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 11/128,374

(22) Filed: May 13, 2005

(65) Prior Publication Data

US 2005/0227416 A1  Oct. 13, 2005

Related U.S. Application Data

(62) Division of application No. 10/674,337, filed on Oct. 1, 2003, now Pat. No. 6,930,401, which is a division of application No. 09/940,537, filed on Aug. 29, 2001, now Pat. No. 6,657,542.

(30) Foreign Application Priority Data

Mar. 13, 2001  (JP)  ............................. 2001-069615

(51) Int. Cl.
*H01L 21/20*  (2006.01)
(52) U.S. Cl. ................................. 438/141; 257/E23.118
(58) Field of Classification Search ................ 438/584, 438/116, 141, FOR. 157, FOR. 415, FOR. 416; 257/679, 688, 689, 696, 694, E23.187, E23.192, 257/E23.114, E23.118
See application file for complete search history.

(56) References Cited

U.S. PATENT DOCUMENTS

| 3,518,753 | A | * | 7/1970 | Heidenreich | ............... 65/59.31 |
| 3,944,749 | A | | 3/1976 | Kahn | ........................ 381/15 |
| 4,746,830 | A | * | 5/1988 | Holland | ................. 310/313 D |
| 4,945,398 | A | | 7/1990 | Kurita et al. | ............... 257/665 |
| 5,623,167 | A | * | 4/1997 | Tabuchi | ..................... 257/794 |
| 5,786,626 | A | | 7/1998 | Brady et al. | ............... 257/673 |
| 6,100,804 | A | | 8/2000 | Brady et al. | ............ 340/572.7 |
| 6,107,920 | A | | 8/2000 | Eberhardt et al. | ....... 340/572.7 |
| 6,232,870 | B1 | * | 5/2001 | Garber et al. | ............. 340/10.1 |
| 6,246,327 | B1 | * | 6/2001 | Eberhardt | ............... 340/572.1 |
| 6,329,917 | B1 | | 12/2001 | Leonard | .................. 340/572.8 |
| 6,534,346 | B2 | * | 3/2003 | Kosokabe | ................... 438/127 |
| 6,919,793 | B2 | * | 7/2005 | Heinrich et al. | ......... 340/10.32 |
| 2005/0062135 | A1 | * | 3/2005 | Tase et al. | .................. 257/620 |

FOREIGN PATENT DOCUMENTS

JP  2000-222540  8/2000

* cited by examiner

*Primary Examiner*—Brook Kebede
(74) *Attorney, Agent, or Firm*—Miles & Stockbridge PC (57) ABSTRACT

An electronic device, in which a flat plate semiconductor and dumets connected to surface electrodes on the front and back surfaces of the semiconductor and to lead wires are encapsulated in a glass tube.

13 Claims, 14 Drawing Sheets

ELECTRONIC DEVICE AND METHOD OF MANUFACTURE THE SAME

CROSS-REFERENCE TO RELATED APPLICATION

This application is a division of application Ser. No. 10/674,337 filed Oct. 1, 2003 now U.S. Pat. No. 6,930,401 which is a division of application Ser. No. 09/940,537 filed Aug. 29, 2001, now U.S. Pat. No. 6,657,542 issued Dec. 2, 2003.

BACKGROUND OF THE INVENTION

The present invention relates to an electronic device such as an IC tag for identifying an object in a non-contact manner, and more particularly to an electronic device mounting thereon a transponder, which wirelessly sends out an identification number, and a method of manufacturing the same.

Japanese Patent Unexamined Publication No. 2000-222540 discloses a non-contact type semiconductor tag, which has a spherical-shaped semiconductor chip connected with a dipole high frequency antenna, as an example of a conventional semiconductor tag (IC tag) making use of a high frequency to transmit information stored in a memory section within its semiconductor chip to an external reader-writer. In this IC tag, the antenna is mechanically mounted to the spherical-shaped semiconductor chip by means of solder.

The above-described IC tag, in which a dipole antenna is soldered to a spherical-shaped semiconductor, is found to cause the following problems. When the dipole antenna is connected to the spherical-shaped semiconductor, a free end portion of the dipole antenna and a connection portion of the spherical-shaped semiconductor need to be positioned relative to each other. The spherical-shaped semiconductor, however, requires a complicated procedure for determining the connection position, which makes it difficult to perform easy and economic positioning.

Further, an integrated circuit is formed on a side of the spherical-shaped semiconductor and susceptible to influences of external light.

An object of the present invention is to provide a highly reliable electronic device.

Another object of the present invention is to provide a method of manufacturing an electronic device with ease.

SUMMARY OF THE INVENTION

Typical configurations of the invention disclosed in the present application are as follows.

The present invention provides an electronic device, in which information stored a memory provided in a semiconductor chip is read through antennae, the electronic device comprising an integrated circuit provided on a main side of the semiconductor chip (IC chip) and including the memory; and electrodes provided on the main and back sides of the semiconductor chip, respectively, and connected to the antennae; and wherein the semiconductor chip and connections of the electrodes and the antennae are encapsulated with glass.

Also, the present invention provides an electronic device comprising a flat plate IC chip having a memory for storing predetermined information and first and second external electrodes formed on front and back surfaces thereof; first and second antennae connected to the first and second external electrodes, respectively, to supply power to the IC chip; and a glass encapsulator provided to cover the IC chip and a part of each of the first and second antennae on sides of the first and second external electrodes.

Also, the present invention provides a method of manufacturing an electronic device comprising the steps of interposing an IC chip, which has a memory for storing predetermined information and first and second external electrodes provided on front and back sides thereof, between first and second antennae in a glass tube; and melting the glass tube to encapsulate the IC chip and connections of the IC chip and the first and second antennae.

Glass referred to here is a material used to encapsulate an IC chip, and includes quartz glass, borate glass, lead glass and the like. A low melting point glass, such as lead glass, is particularly desirable.

DESCRIPTION OF THE EMBODIMENTS

Figure 1A:
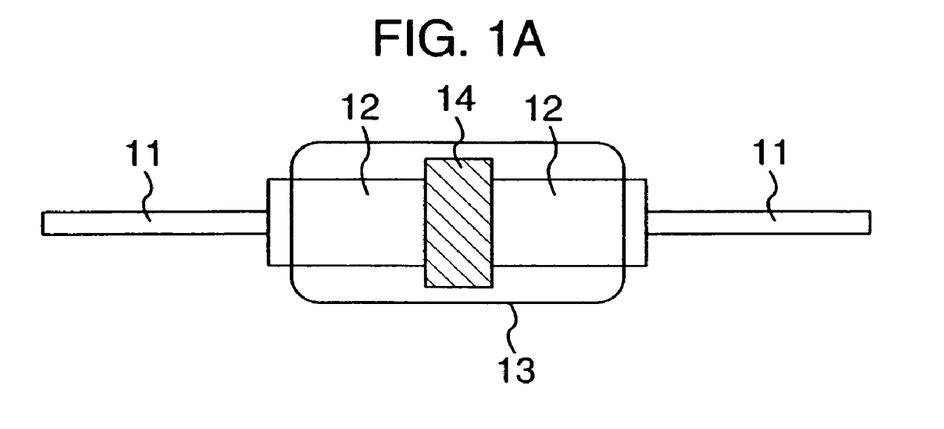
FIG. 1A and FIG. 1B are cross sectional views showing electronic devices according to the present invention.
Figure 1B:
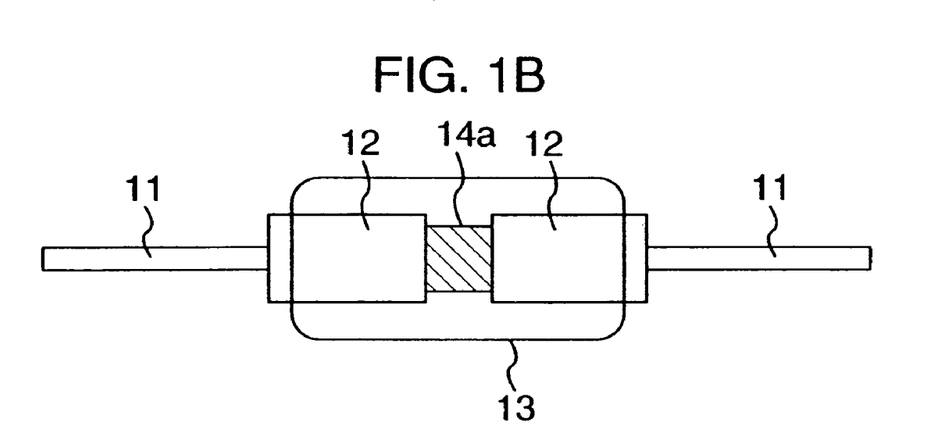

The construction of electronic devices according to the present invention will be described with reference to FIG. 1A and FIG. 1B, which are cross sectional views showing the electronic devices according to the invention. In the respective figures, a lead wire 11 is integrally connected to dumets 12 to form first and second antennae. An IC chip (wireless chip) 14 adapted to operate under power received from the antenna is constructed to be sandwiched between the dumets 12 (first antenna dumet and second antenna dumet). A glass body 13 is tubular-shaped and encapsulates the wireless chip and a part of the dumets. In FIG. 1A, a diagonal length of the wireless chip 14 is larger than a diameter of the dumets 12. In FIG. 1B, a diagonal length of a small scale wireless chip 14a is smaller than the diameter of the dumets. The dumets are tip end metal portions, which are larger in diameter than the lead wire 11 to facilitate interposing therebetween the wireless chip 14 and the small scale wireless chip 14a. The wireless chip may be made plate-shaped and provided on front and back sides thereof with electrodes to facilitate positioning for connection to the dumets. The wireless chip 14 and the small scale wireless chip 14a are interposed between the dumets 12 to enable reducing incidence of external light on the IC chip. In particular, with the small scale wireless chip 14a, the effect of shutting off external light is considerable. The glass tube may be freely shaped, such as cylindrical, rectangular parallelepiped or the like, but must have a hollow space sized to be capable of encapsulating therein the IC chip and the dumets. Preferably, the glass tube has a hollow space sized to enable the IC chip to be encapsulated in the glass tube in a direction, in which the electrodes on the front and back sides of the IC chip face the open ends of the glass tube. Thereby, the IC chip can be interposed between the dumets easily. An external diameter of the glass tube is set to be in the range of 0.1 mm to 5 mm whereby the glass tube is not readily susceptible to external stresses and easy to handle. In particular, when used as a tag, such small size eliminates interference upon handling of baggage and the tag is not easily lost. Also, the inner diameter of the glass tube is set to be in the range of 0.09 mm to 4.9 mm whereby it is possible to ensure the mechanical strength.

Figure 2A:
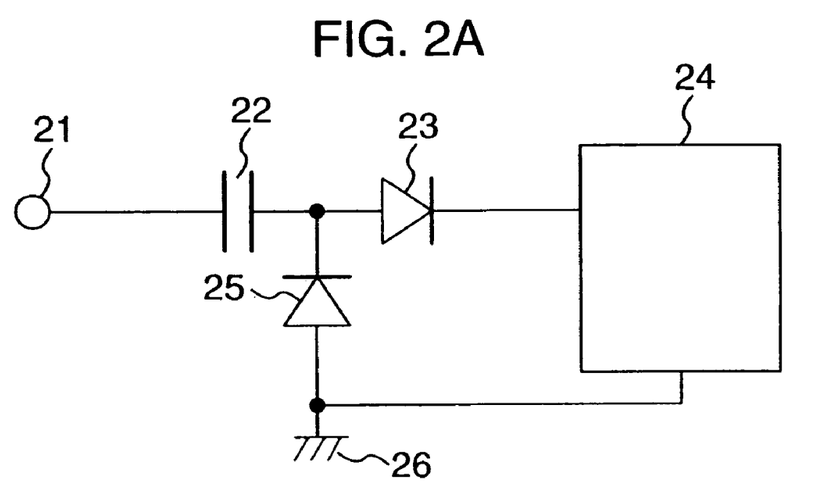
FIG. 2A is a view showing a circuit of an IC chip according to the present invention and FIG. 2B is a schematic cross sectional view showing the IC chip.

Next, a schematic construction of an electronic device according to the present invention will be described with reference to FIG. 2A and FIG. 2B. In addition, while an explanation will be given to a wireless chip, a small scale wireless chip can be constructed in a similar manner. FIG. 2A is a schematic view showing a circuit configuration of the wireless chip. As shown in the figure, a surface electrode 21 of the wireless chip is connected to a coupling condenser 22 provided in a circuit within the wireless chip. The coupling condenser 22 is connected to a rectifier diode 23 and a clamp diode 25. The rectifier diode 23 is further connected to a logic circuit 24. The logic circuit 24 is supplied with current through the rectifier diode 23. The clamp diode 25 and the logic circuit 24 are connected to a common terminal (hereinafter referred to as a ground) 26.

Figure 2B:
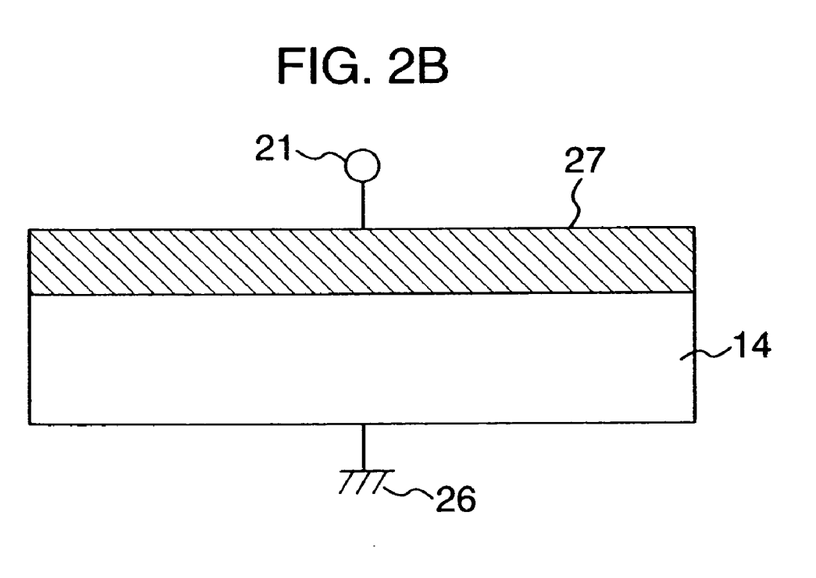

FIG. 2B is a schematic cross sectional view showing the wireless chip formed with the circuit of FIG. 2A. The surface electrode 21 is on a surface device layer 27, and the ground 26 is on a back side of the wireless chip 14. The ground 26 is connected to an external lead wire through a dumet, and the surface electrode 21 is similarly connected to an external lead wire through a dumet. The two terminals, that is, the surface electrode 21 of wireless chip and the ground 26 shown in FIG. 2A are connected to an external antenna to enable ensuring a communication distance. High frequency electromagnetic wave energy is received from the antenna and DC current is obtainable by a rectifying circuit in the wireless chip. Thereby, the wireless chip can be operated without a battery. The ground terminal of this circuit is connected to a substrate of the semiconductor chip. Electrode terminals of the wireless chip are formed on front and back sides of the semiconductor chip, and the physical areas of the surface electrodes are enlarged up to the maximum planar size (entire chip surface) of the wireless chip. The larger the surface electrode areas, the larger regions shielded by the electrode material, so that influences of external light can be reduced.

Figure 3A:
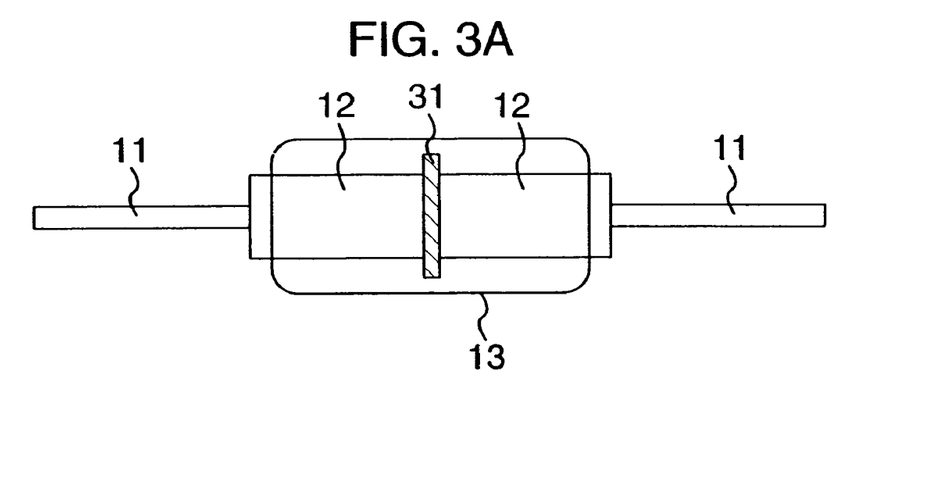
FIG. 3A and FIG. 3B are cross sectional views showing other electronic devices according to the present invention.

A schematic construction of further electronic devices according to the present invention will be described with reference to FIG. 3A and FIG. 3B, which are cross sectional views showing electronic devices of the invention. The same reference numerals as those in FIG. 1 designate the same elements. The reference numeral 31 designates a thin type wireless chip as thin-layered and the reference numeral 31a designates a small scale thin type wireless chip as thin-layered. The thin-layered structure makes it possible to reduce influences of external light entering from sides of the wireless chip.

Figure 3B:
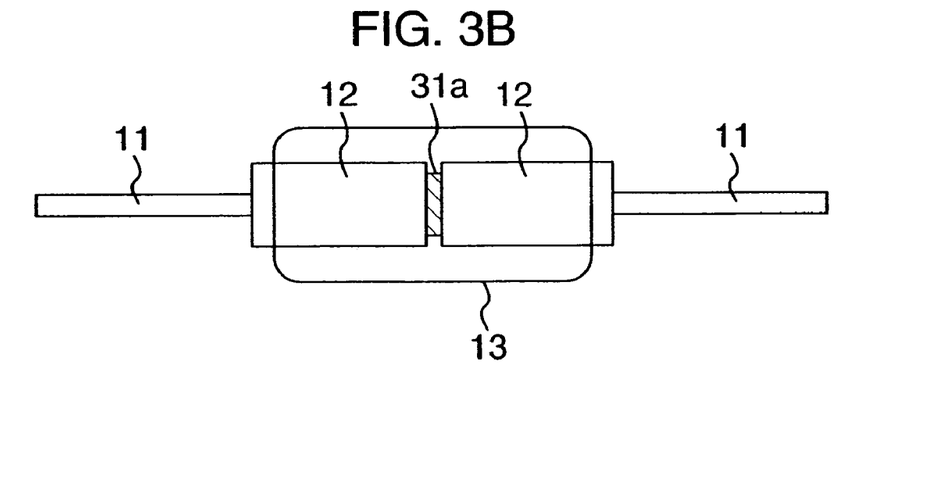

Provision on the electronic devices of FIGS. 1A and 1B and FIGS. 3A and 3B of an identifier indicating that the IC chip is encapsulated makes it possible to clarify that the chip encapsulated in the glass tube is an IC chip. A mark as the identifier can be applied on the glass tube surface. Alternatively, the IC chip may be distinguished by color. In FIGS. 1A and 1B and FIGS. 3A and 3B, the entire or a central part of the wireless chip is covered at its front and back sides with metal dumets, which are free from transmission of light to enable preventing the wireless chip from causing malfunction due to light. As shown in FIG. 1B and FIG. 3B, the wireless chip is small as compared with the dumets, thereby making the construction adequately resistant to light. In the constructions shown in FIGS. 1A and 1B and FIGS. 3A and 3B, the wireless chip is hermetically encapsulated with glass and both ends of the wireless chip are interposed between hard dumets, so that a fairly high reliability can be ensured in terms of corrosion resistance and mechanical strength.

Figure 4:
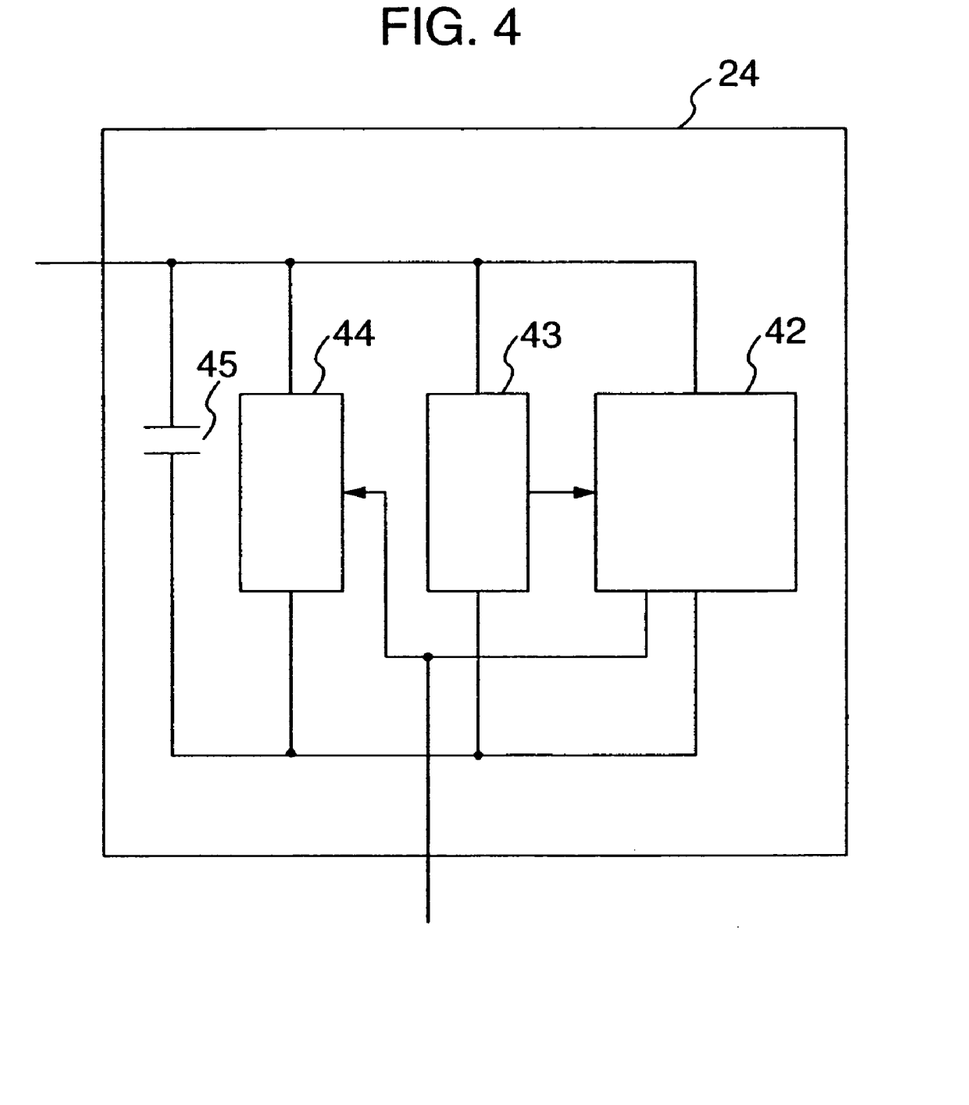
FIG. 4 is a conceptional view showing a logic circuit mounted in the IC chip according to the present invention.

An exemplary configuration of the logic circuit 24 in FIG. 2A will be described below with reference to FIG. 4. A memory circuit 42 is operated by a clock signal from a clock extract circuit 43, and its output signal is input into a load switch 44 for load variation operation.

Also, a smoothing condenser 45 is inserted between a cathode of the rectifier diode 23 and the ground 26 and accumulates DC current from a rectifier circuit (a rectifier diode in this case) to generate DC voltage. Energy obtained by the wireless chip causes DC voltage to rise from about 0.3 V to 30 V and above. Since an excessive voltage may cause breakage of a gate of MOS devices in the logic circuit 24, a voltage suppression circuit is added as desired.

The smoothing condenser 45 is also necessary for stabilization of power supply voltage and serves to absorb a feedthrough current, which is generated upon operation of the logic circuit 24 to flow to a gate circuit of the CMOS logic. The memory circuit 42 can take a variety of configurations depending on specifications such as memory capacity, or a read inclusive use or writability. The clock extract circuit 43 is such that a clock signal is modulated with a high-frequency carrier wave, which is transmitted from the reader to a transponder (a wireless chip with an antenna), and an original low-frequency clock signal is obtained when the clock extract circuit, of which transponder receives the carrier wave, demodulates.

Figure 5A:
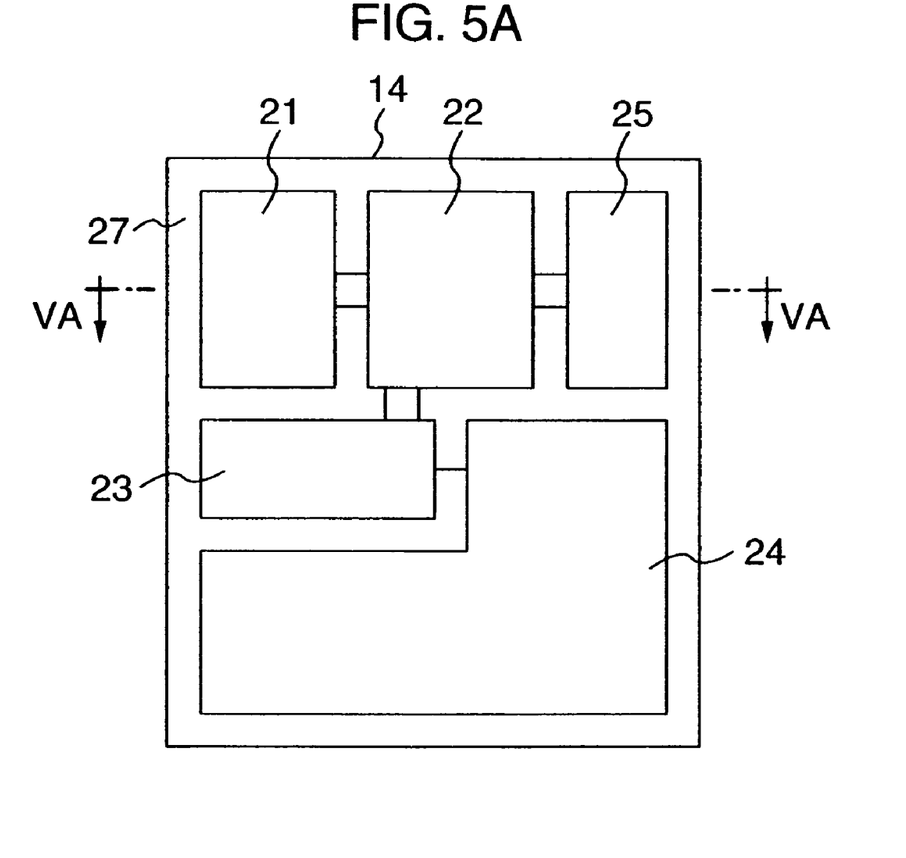
FIG. 5A is a conceptional view showing a circuit of the IC chip and FIG. 5B is a cross sectional view showing the IC chip.
Figure 5B:
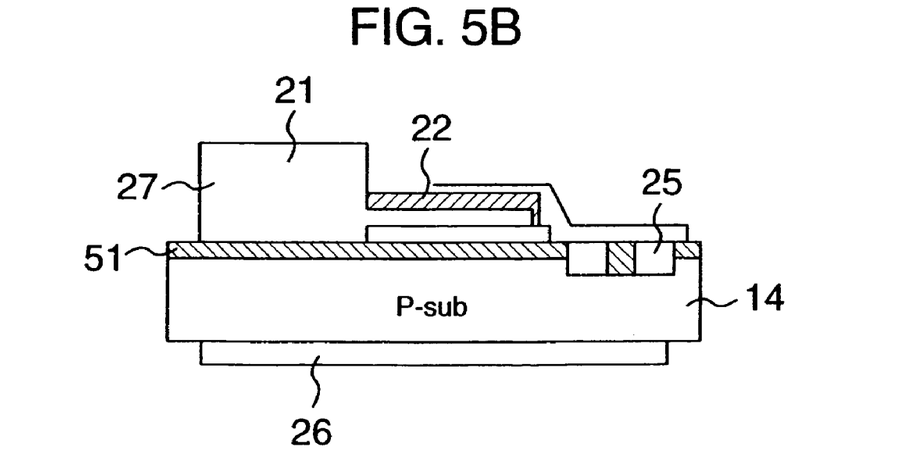

A wireless chip will be explained further with reference to FIG. 5A and FIG. 5B. FIG. 5A is a plan view showing the outline of the wireless chip 14. Formed on a surface device layer 27 are a surface electrode 21 on a main side of the wireless chip, a coupling condenser 22 connected to the surface electrode 21, a clamp diode 25 and a rectifier diode 23, which are connected to the coupling condenser 22, and a logic circuit 24 connected to the rectifier diode 23. FIG. 5B is a cross sectional view showing a principal part of the wireless chip 14. An insulating film (here, silicon oxide film) 51 is formed on the chip surface to prevent a possible short-circuit between the surface electrode 21 on the front side of the wireless chip and a substrate of the wireless chip.

FIG. 5B is a cross sectional view taken along the line VA—VA of FIG. 5A. The wireless chip 14 has long sides of 0.01 mm to 0.5 mm and is sized to be received in a small glass tube, thus assuring excellent reliability and economy. The wireless chip is sized to be around 0.3 mm like silicon diodes, whereby the production facility can be shared to manufacture transponders at low cost. In FIG. 5B, the surface electrode on the front side of the wireless chip is made from a metal plated to a thickness of approximately 10 µm. The thickness preferably ranges between 0.1 µm and 50 µm.

The coupling condenser 22 is formed by a lower electrode connected to the surface electrode 21 on the front side of the wireless chip, an upper electrode connected to the clamp diode 25 and an insulating film (here, a silicon oxide film) interposed between them. A substrate of the wireless chip is of p-type, whereby a pn junction diode can be formed from the p-type substrate and the n-type surface diffusion layer. At this time, the substrate may be grounded. A diode with a substrate being grounded in device design can also be formed from n-type MOS. A ground electrode 26 is formed on a back side of the substrate to be used as an electrode of the circuit. In this manner, the front and back sides of the wireless chip are designed to provide electrodes whereby a glass-encapsulated transponder can be formed.

In connection with the thin type wireless chip shown in FIG. 3A and FIG. 3B, the relationship between a thickness of a wireless chip and the performance of an electronic device will be explained with reference to FIG. 6.

Figure 6:
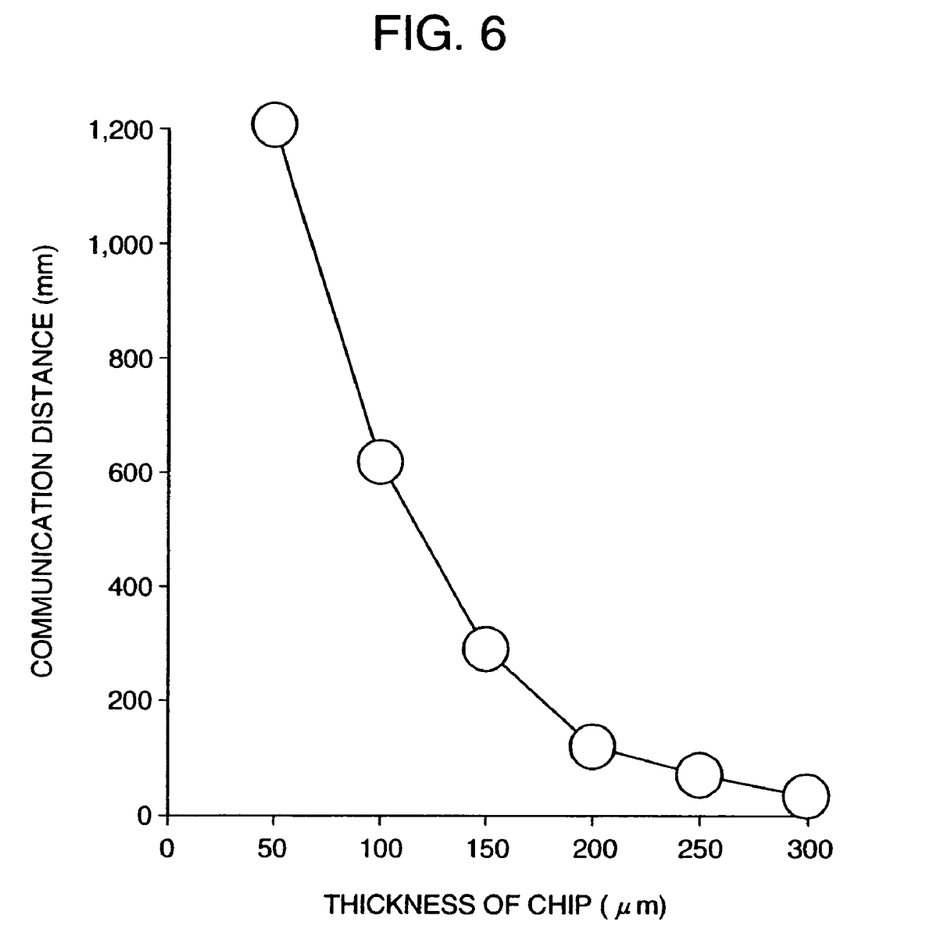
FIG. 6 is a characteristic diagram showing the relationship between a thickness of the IC chip according to the present invention and a communication distance.

In FIG. 6, a thickness of the wireless chip is represented on the axis of abscissa and a communication distance between a transponder and a reader is represented on the axis of ordinate. Frequency used here is 2.45 GHz. The thickness of a wireless chip and the ground series resistance of a transponder circuit are proportional to each other. The smaller the ground series resistance, the longer the communication distance. The larger the ground series resistance, the greater the circuit loss resistance and the shorter the communication distance. When the chip thickness is 100 µm or less, the communication distance is 1200 mm, and when the chip thickness is 200 µm, the communication distance is 150 mm.

The communication distance varies depending on the circuit configuration and the device performance, for example, threshold voltage, current amplification factor and the like, and also on the density of the substrate of the wireless chip.

The communication distance also varies depending on a material of the lead wire. When the lead wire is made from a material consisting mainly of iron, the communication distance is 150 mm for the wireless chip thickness of 200 µm. When the lead wire is made from copper, the communication distance can be extended to 250 mm. This is because loss of the lead wire depends on the resistance of the lead wire and on a state of the plated surface. With a transponder making use of high-frequency carrier waves, the skin effect causes current to concentrate on a surface layer, so that loss of the lead wire depends on the resistance of the lead wire surface. When the lead wire is made mainly from iron and plated with copper, the communication distance is 200 mm for the wire chip thickness of 200 µm.

When frequency is 2.45 GHz, substantially the same communication distance as that for the copper lead wire can be obtained provided that the thickness of copper plating is set to 2–3 µm.

Figure 7A:
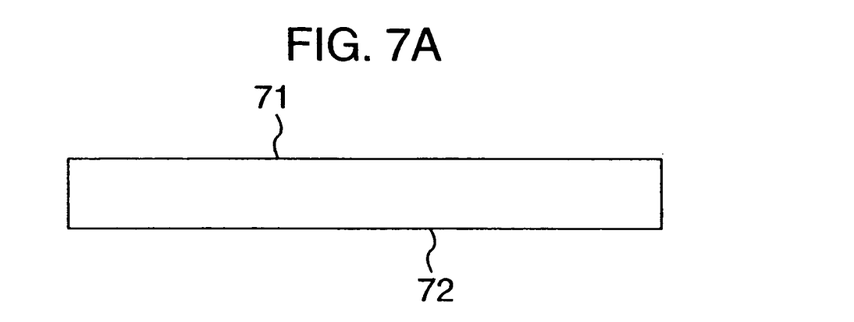
FIGS. 7A, 7B, 7C and 7D are cross sectional views showing processes of forming electrodes of the IC chip according to the present invention.

The process of manufacturing a wireless chip will be explained with reference to FIG. 7A and FIG. 7B. FIG. 7A is a cross sectional view showing a semiconductor wafer formed with a plurality of wireless chip devices. In FIG. 7A, an upper surface indicates a back side 71 of the semiconductor wafer, and a lower surface indicates a main surface 72 of the semiconductor wafer. While the thickness of the semiconductor wafer is set to 150 µm, it may be set in the range of 0.1 µm to 300 µm. A plurality of wireless chip devices are formed on the main surface.

Figure 7B:
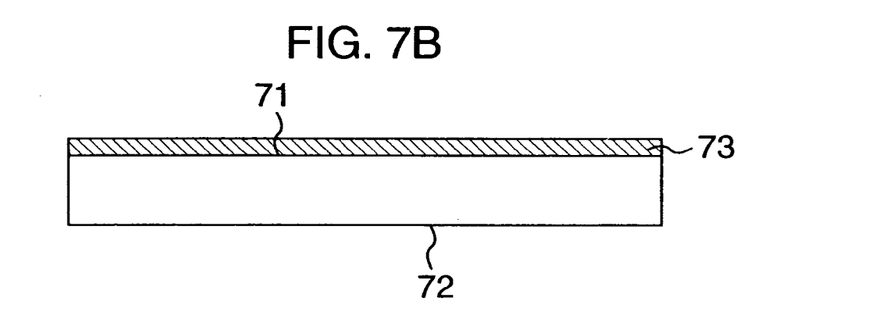

FIG. 7B is a cross sectional view showing a state immediately after a gold deposition layer 73 was formed on the back side 71 of the wafer. First, the gold deposition layer 73 was formed to provide an ohmic contact. The thickness of the gold deposition layer 73 was set to 10 µm but can be set in the range of 0.1 µm to 80 µm. When such thickness is less than 0.1 µm, the bond strength may cause a problem. When such thickness is more than 80 µm, a difference in thermal expansion between the layer and glass may cause a problem. Subsequently, an antimony deposition layer 74 was formed to enhance adhesion between gold and silver.

Figure 7C:
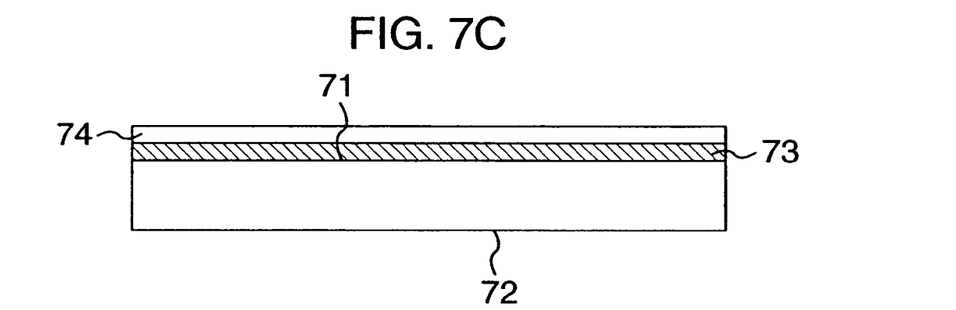

FIG. 7C is a cross sectional view showing a state immediately after the antimony deposition layer 74 was formed on the gold deposition layer 73. The thickness of the antimony deposition layer 74 was set to 10 µm, but can be set in the range of 0.1 µm to 80 µm. When such thickness is less than 0.1 µm, the bond strength may cause a problem. When such thickness is more than 80 µm, a difference in thermal expansion between the layer and glass may cause a problem. Subsequently, a silver deposition layer 75 was formed to enhance adhesion between the layer and the dumets.

Figure 7D:
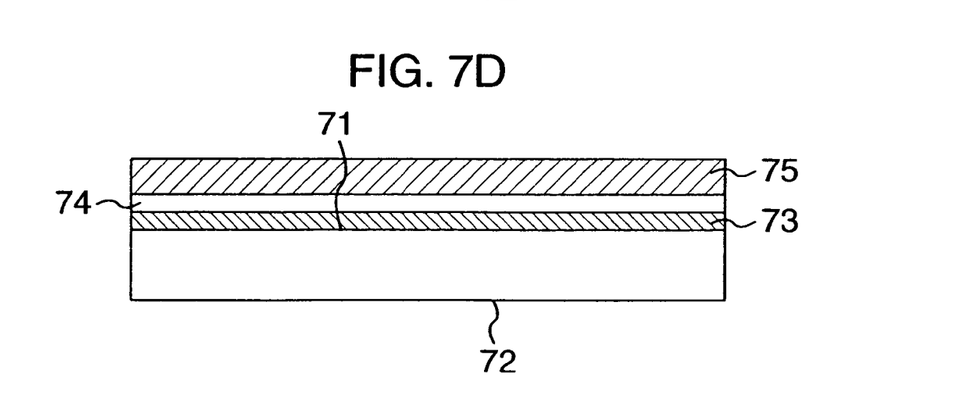

FIG. 7D is a cross sectional view showing a state immediately after the silver deposition layer 75 was formed on the antimony deposition layer 74. The thickness of the silver deposition layer 75 was set to 10 µm, but can be set in the range of 0.1 µm to 80 µm. When such thickness is less than 0.1 µm, the bond strength may cause a problem. When such thickness is more than 80 µm, a difference in thermal expansion between the layer and glass may cause a problem. This process comprised depositing metal layers on the entire back side of the wafer to form an electrode on the back side of the wireless chip 14. This wafer was stuck to a dicing tape and diced to wireless chips each sized to be about 0.3 mm square, although dicing can be made in the range of 0.01 mm to 0.5 mm square. Chips having a thickness of less than 0.01 mm are difficult to handle. Also, chips having a thickness of more than 0.6 mm are problematic in parasitic resistance. The dicing tape made from PET and vinyl chloride is used. It is desirable to use PET, which does not cause environmental disruption upon disposal or burning.

Figure 8A:
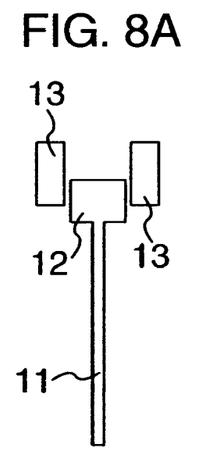
FIGS. 8A, 8B, 8C and 8D are cross sectional views showing processes of assembling the electronic device according to the present invention.
Figure 8B:
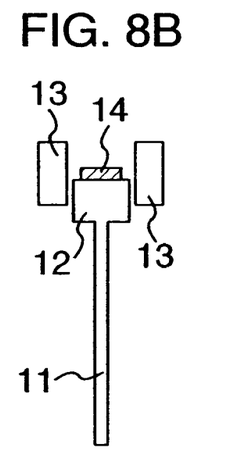
Figure 8C:
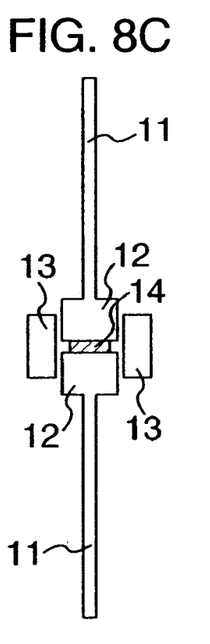
Figure 8D:
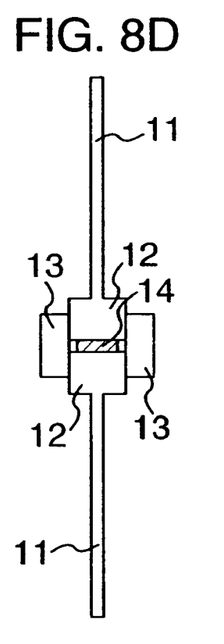

A method of manufacturing the electronic device will be described with reference to FIG. 8A to FIG. 8D. First, an upper end of a vertically erected dumet 12 connected to the lead wire 11 is inserted into the glass tube 13 from below (FIG. 8A). Then, the wireless chip 14 is placed on a top of the dumet 12 inserted into the glass tube 13 (FIG. 8B). Subsequently, another dumet 12 is inserted into the glass tube 13 from above to clamp the wireless chip 14 between the dumets (FIG. 8C). At this time, pressure applied to the dumets 12 is 5–10 MPa. As a result, the respective electrodes on the front and back sides of the wireless chip are electrically connected with the dumets. Then, the glass tube 13 is heated at high temperatures to permit the glass to melt and adhere to the dumets 12 (FIG. 8D).

Having completed the above steps, the wireless chip 14 is encapsulated inside the glass tube 13. Here, the dumets 12 used were formed from a nickel-iron alloy plated with copper. The use of a nickel-iron alloy allows the dumets and the electronic devices incorporating them to be transported by magnets. Glass can be controlled in melting point in accordance with a material of the glass. Here, lead glass was used to have the melting point of about 450° C.

In the case where aluminum or aluminum alloy of a low melting point is used as a wiring material for the wireless chip, it is preferable to use glass, which melts at about 450° C. or lower, and materials adapted for thermal shrinking (e.g., plastics).

In order that the wireless chip resists relatively high temperatures, it is effective to deposit a nitride film on the wireless chip to prevent escape of hydrogen from the hydrogen annealing and to use, instead of aluminum wire, a high temperature resistant wire material such as copper, tungsten and titanium.

Figure 13:
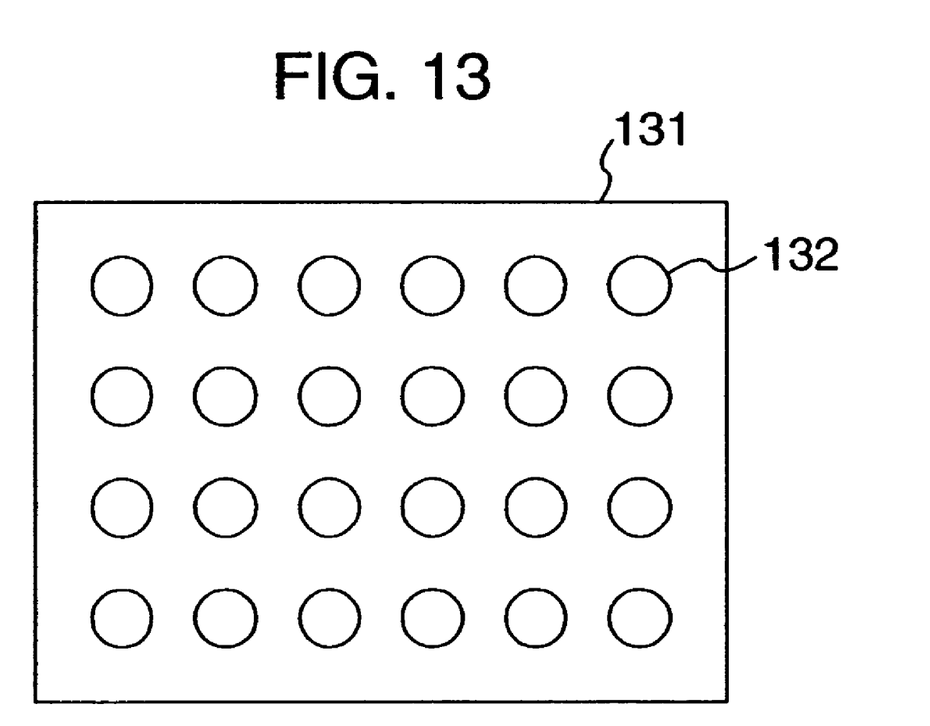
FIG. 13 is a plan view showing a jig for assembling the electronic device according to the present invention.

The use of low-melting point glass enables lowering the encapsulating temperature and reducing thermal effect on the wireless chip, whereby it is possible to enhance the production yields of the transponders. With the assembly method shown in FIG. 8A to FIG. 8D, shaking of a jig with ultrasonic waves enables the wireless chip to fall into the glass tube by gravity to positionally align the dumets and the glass tube and to assemble several thousands or tens of thousands of electronic devices at a time, which can realize an assembly having an outstanding economy. An example of an assembly jig 131 is shown in FIG. 13. The jig is provided with a large number of openings 132, into which the glass tubes are to be inserted.

Influences of the lead length (length of the antenna) on the communication distance will be explained below with reference to FIG. 9. The axis of abscissa in this diagram indicates a lead length of the transponder and the axis of ordinate indicates a communication distance between the transponder and the reader. A lead length corresponding to one-half a wavelength of a carrier wave used (about 6 cm for 2.45 GHz) provides the most optimum condition of resonance, in which the communication length is largest. The shorter the lead length, the shorter the communication distance. As the lead length increases from the optimum length, however, the communication distance does not significantly decrease. It is possible to use a lead length in the range of one-half wavelength to one wavelength.

Figure 9:
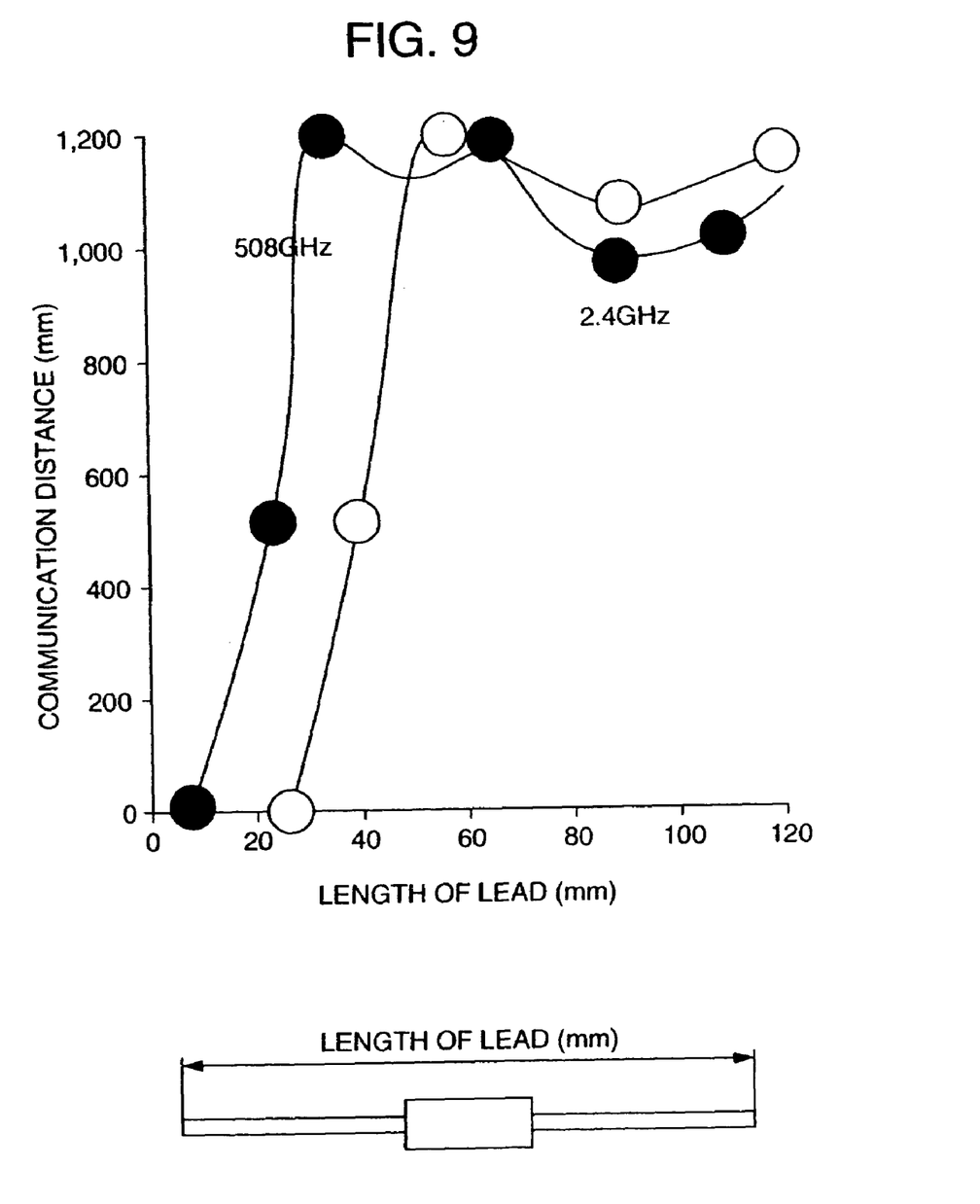
FIG. 9 is a characteristic diagram showing the relationship between an overall length of lead of the electronic device according to the present invention and a communication distance.
Figure 14:
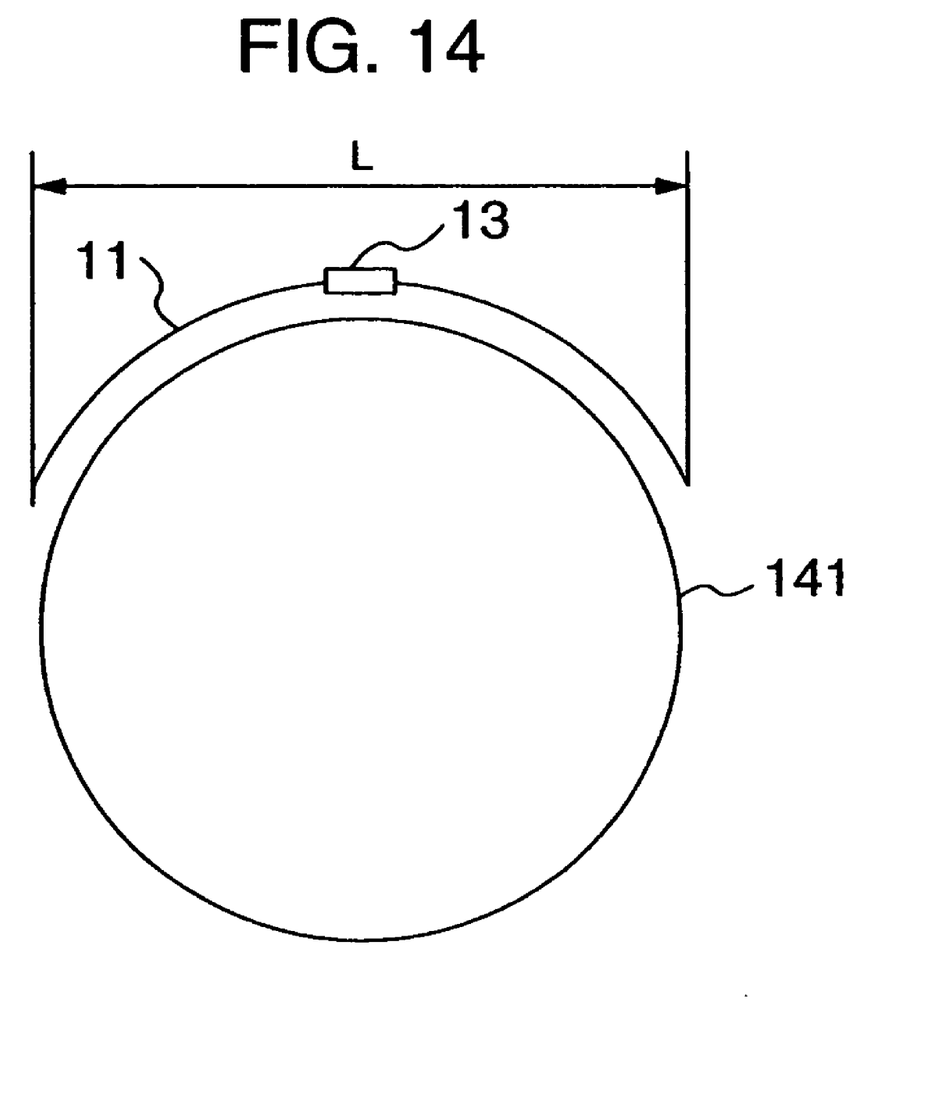
FIG. 14 is a view showing a length of an antenna when a lead wire of the electronic device according to the present invention is curved.

The lead length is prescribed as an overall length, and so left and right portions of a lead wire of the transponder shown in FIG. 9 need not be equal to each other in length. Further, when the lead wire is bent along a member having a curved surface 141 as shown in FIG. 14, a maximum linear distance L of the lead wire suffices to be set in the range of one-half to one wavelength of the carrier wave. Also, the lead wire was formed from a material such as nickel and iron, which are easily magnetized, and the electronic device was operated in an environment where a magnetic field exists. However, the performance of the transponder was not affected as compared with the case where an unmagnetizable material was used. This is because voltage and current caused by energy of the electric field generate resonance in the lead to be concentrated on the wireless chip encapsulated in the glass portion, thus allowing energy to flow in high-frequency.

Figure 10:
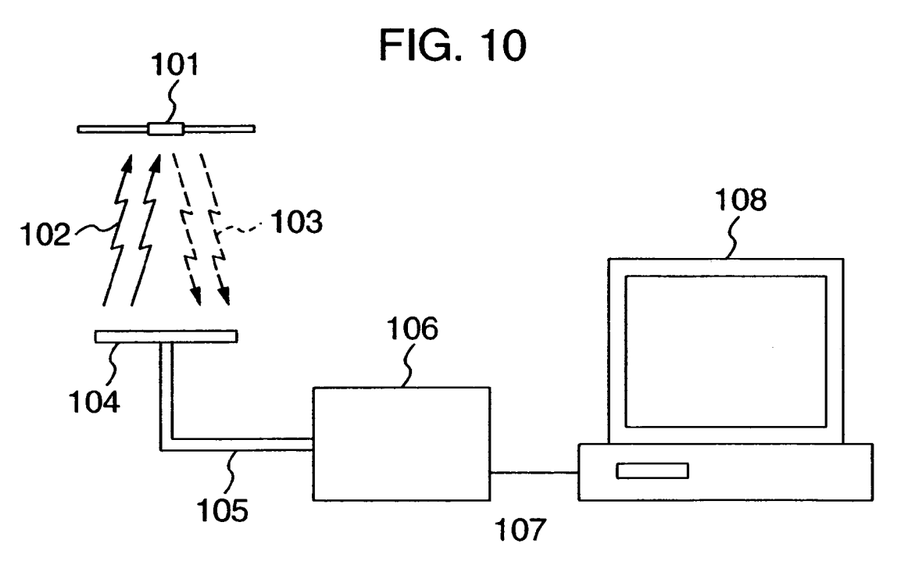
FIG. 10 is a view showing a reader system for reading stored information from the electronic device according to the present invention.

Subsequently, an example of a reader system for retrieving stored information from the electronic device according to this invention will be explained with reference to FIG. 10. In FIG. 10, the reference numeral 101 designates an electronic device (glass-encapsulated transponder), 104 an antenna, 106 a reader, 105 a coaxial line connecting the reader 106 and the antenna 104 to each other, 108 a personal computer, and 107 a serial interface. When the glass-encapsulated transponder 101 receives an electro-magnetic energy through radio wave 102 from the reader, the wireless chip of the transponder is operated to transmit response data 103 to the antenna 104, which is connected to the reader 106 via the coaxial line 105. Frequency used is 2.45 GHz, the electronic device including antenna has a length of 55 mm, the lead wire has a diameter of 1 mm, and the glass tube has a diameter of 3 mm. The reader is connected to the personal computer 108 through the serial interface 107. Read command is input from the personal computer whereby 128-bit data (ROM) are read. With this arrangement, the transponder may be attached to every object to be used for delivery and registered mail services.

Figure 11:
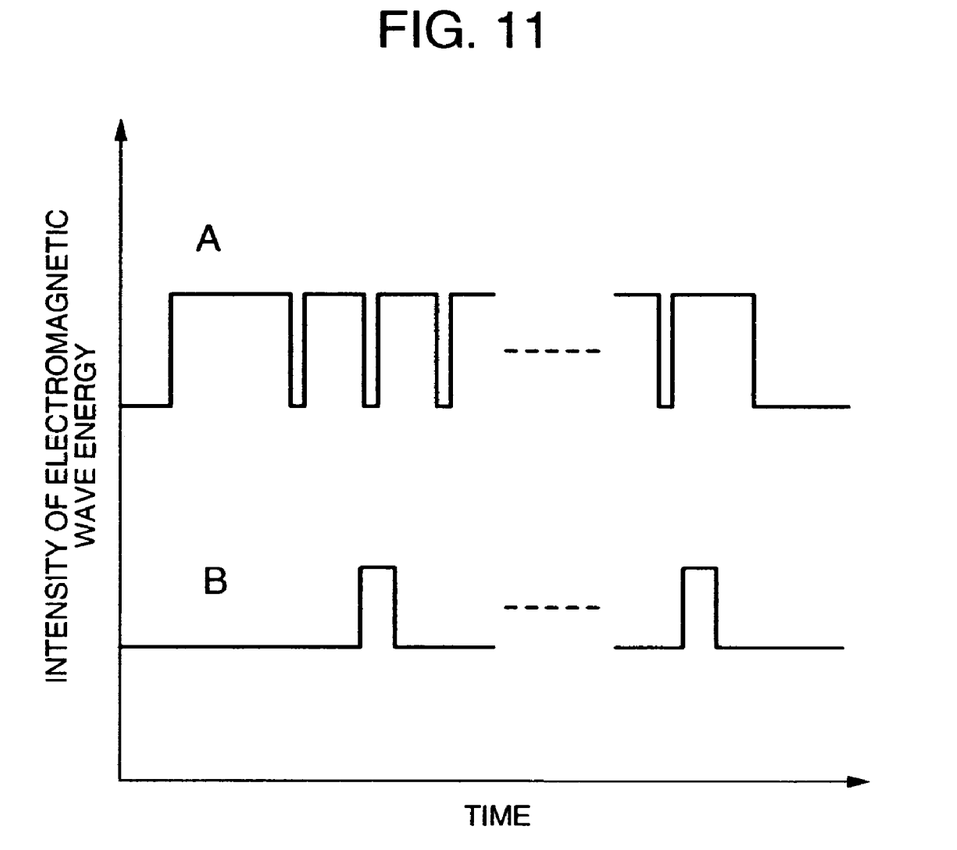
FIG. 11 is a diagram showing an air format A of transmission data transmitted from the reader to the electronic device and an air format B of response data from the electronic device according to the present invention.

FIG. 11 shows air formats of this transponder (sequences of power of radio wave). Waveform A represents an air format of the radio wave 102 transmitted from the antenna 104 of the reader 106, and waveform B represents an air format of response data from the transponder 101. These data consist of numerals "0" and "1".

Figure 12:
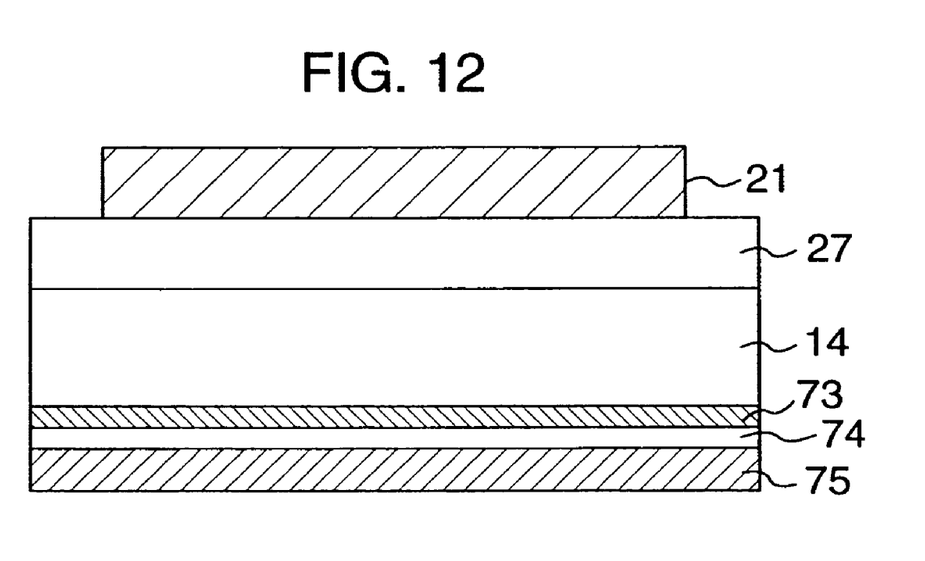
FIG. 12 is a schematic cross sectional view showing the IC chip according to the present invention.

FIG. 12 shows a cross-sectional construction of the wireless chip according to this invention, which wireless chip is featured to have metal electrodes on front and back sides thereof. In addition, the electrode 21 is formed prior to dicing.

The use of a flat plate semiconductor enables easy positioning. Encapsulation with the glass tube can improve reliability. Further, the batch production method enables manufacture of transponders at low cost.

What is claimed is:

1. A method of manufacturing an electronic device, comprising the steps of:

providing an IC chip having a memory to store predetermined information and first and second external electrodes provided on front and back sides thereof, respectively;

providing first and second antennae, each having a dumet at one end thereof;

providing a glass tube;

inserting a portion of the dumet of the first antenna into the glass tube;

placing the IC chip in contact with the dumet of the first antenna arranged in the glass tube such that the first external electrode is disposed in contact with a side of the first antenna dumet;

placing a portion of the dumet of the second antenna in contact with the IC chip arranged in the glass tube such that the dumet of the second antenna is disposed in contact with a side of the second external electrode; and melting the glass tube to fix the IC chip and the dumets of the first and second antennae to maintain an electrical connection between the IC chip and the first antenna dumet and the second antenna dumet;

wherein the IC chip comprises a logic circuit, a first diode, a second diode and a condenser;

wherein the condenser is connected between the first external electrode and both a cathode of the first diode and an anode of the second diode;

wherein the anode of the first diode is connected to the second external electrode and a ground line of the logic circuit; and wherein a cathode of the second diode is connected to a power supply line of the logic circuit.

2. The method of manufacturing an electronic device according to claim 1, wherein the IC chip has a thickness in the range of 0.1 µm to 200 µm.

3. The method of manufacturing an electronic device according to claim 1, wherein the IC chip includes long sides having a length in the range of 0.01 mm to 0.5 mm.

4. The method of manufacturing an electronic device according to claim 1, wherein the first and second antennae are different in length.

5. The method of manufacturing an electronic device according to claim 1, wherein the first and second external electrodes are provided on front and back sides of the IC chip, respectively.

6. The method of manufacturing an electronic device according to claim 1, wherein the dumets are of larger diameter than a length of a diagonal of the IC chip.

7. The method of manufacturing an electronic device according to claim 6, wherein each dumet has a larger diameter than a lead wire of the corresponding antenna.

8. The method of manufacturing an electronic device according to claim 1, wherein the first and second antennae are arranged to be perpendicular to the front and back sides of the IC chip.

9. The method of manufacturing an electronic device according to claim 1, wherein a substrate voltage of the IC chip is applied from the antenna coupled to the back side of the IC chip.

10. The method of manufacturing an electronic device according to claim 1, wherein said placing of the IC chip on the dumet of the first antenna arranged in the glass tube includes shaking a jig having a plurality of openings with ultrasonic waves.

11. The method of manufacturing an electronic device according to claim 2, wherein the first and second external electrodes are provided on front and back sides of the IC chip, respectively.

12. The method of manufacturing an electronic device according to claim 3, wherein the first and second external electrodes are provided on front and back sides of the IC chip, respectively.

13. The method of manufacturing an electronic device according to claim 4, wherein the first and second external electrodes are provided on front and back sides of the IC chip, respectively.

* * * * *